United States Patent
Reichel et al.

(10) Patent No.: US 9,612,158 B2
(45) Date of Patent: Apr. 4, 2017

(54) DEVICE FOR DETERMINING THE TEMPERATURE OF A SUBSTRATE

(71) Applicant: CENTROTHERM THERMAL SOLUTIONS GMBH & CO. KG, Blaubeuren (DE)

(72) Inventors: Denise Reichel, Großolbersdorf (DE); Wilfried Lerch, Dornstadt-Tomerdingen (DE); Jeff Gelpey, Boston, MA (US); Wolfgang Skorupa, Dresden (DE); Thomas Schumann, Dresden (DE)

(73) Assignee: Centrotherm Thermal Solutions GmbH & Co. KG (DE)

( * ) Notice: Subject to any disclaimer, the term of this patent is extended or adjusted under 35 U.S.C. 154(b) by 0 days.

(21) Appl. No.: 14/351,590

(22) PCT Filed: Oct. 17, 2012

(86) PCT No.: PCT/EP2012/004347
§ 371 (c)(1),
(2) Date: Apr. 14, 2014

(87) PCT Pub. No.: WO2013/056828
PCT Pub. Date: Apr. 25, 2013

(65) Prior Publication Data
US 2014/0248720 A1    Sep. 4, 2014

(30) Foreign Application Priority Data
Oct. 17, 2011    (DE) .......................... 10 2011 116 243

(51) Int. Cl.
*H01L 21/66*    (2006.01)
*H01L 21/67*    (2006.01)
(Continued)

(52) U.S. Cl.
CPC ........... *G01J 5/0007* (2013.01); *G01J 5/0834* (2013.01); *H01L 21/67115* (2013.01);
(Continued)

(58) Field of Classification Search
None
See application file for complete search history.

(56) References Cited

U.S. PATENT DOCUMENTS

| | | |
|---|---|---|
| 5,154,512 A | 10/1992 | Schietinger et al. |
| 5,318,362 A | 6/1994 | Schietinger et al. |

(Continued)

*Primary Examiner* — Calvin Choi
*Assistant Examiner* — Xiaoming Liu
(74) *Attorney, Agent, or Firm* — Tarolli, Sundheim, Covell & Tummino LLP

(57) ABSTRACT

An apparatus for determining the temperature of a substrate, in particular of a semiconductor wafer during a heating thereof by means of a first radiation source is described. Furthermore, an apparatus and a method for thermally treating substrates are described, in which the substrate is heated by means of at least one first radiation source. The apparatus comprises a first grating structure having grating lines, which are opaque with respect to a substantial portion of the radiation of the first radiation source, wherein the grating structure is arranged between the first radiation source and the substrate, and a drive unit for moving the first grating structure. Furthermore, a first radiation detector is provided, which is directed directly onto the surface of the substrate facing the grating structure, and a device for determining radiation emitted by the substrate due to its own temperature and for determining the temperature of the substrate on the basis of the radiation detected by the first radiation detector.

13 Claims, 4 Drawing Sheets

(51) Int. Cl.
*G01J 5/00* (2006.01)
*G01J 5/08* (2006.01)

(52) U.S. Cl.
CPC ........ *H01L 21/67248* (2013.01); *H01L 22/12* (2013.01); *H01L 2924/0002* (2013.01)

(56) References Cited

U.S. PATENT DOCUMENTS

| | | | |
|---|---|---|---|
| 6,316,747 B1 | 11/2001 | Blersch et al. | |
| 2003/0178418 A1* | 9/2003 | Herold et al. | 219/685 |
| 2005/0008351 A1* | 1/2005 | Gat et al. | 392/416 |
| 2005/0237617 A1* | 10/2005 | Carr et al. | 359/569 |
| 2008/0248657 A1* | 10/2008 | Nenyei et al. | 438/799 |

* cited by examiner

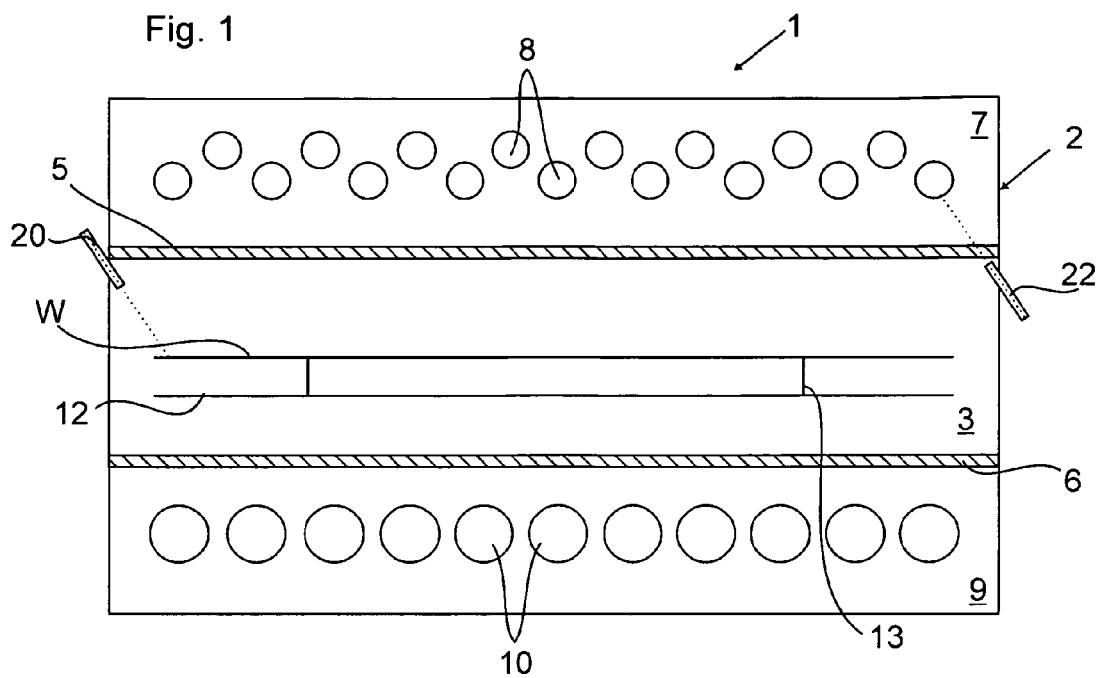
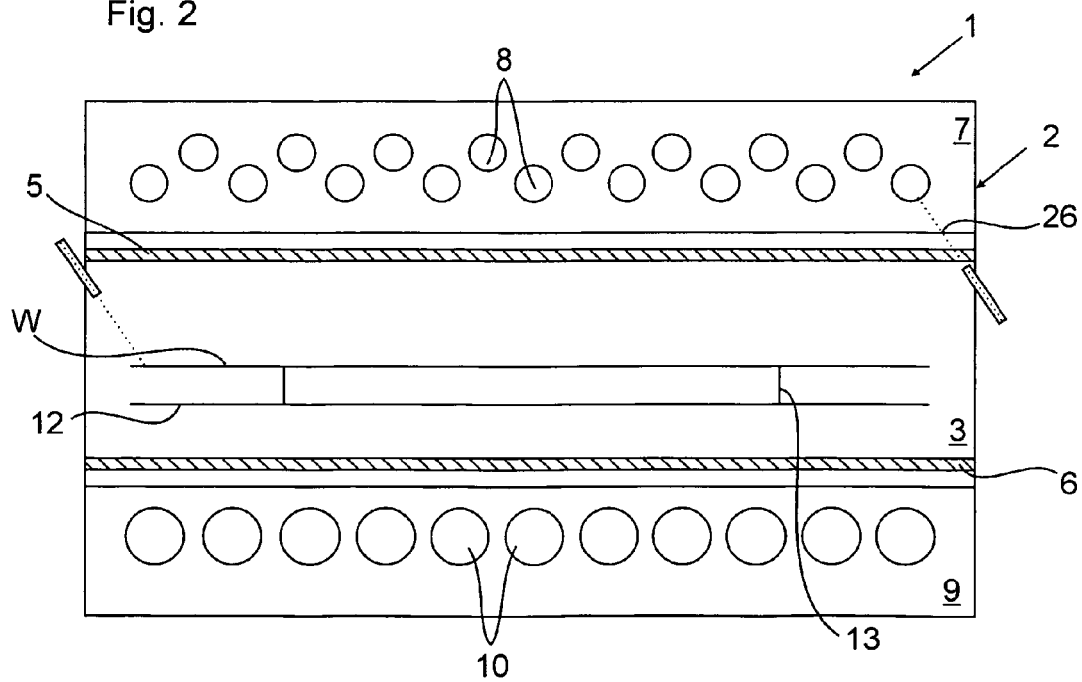

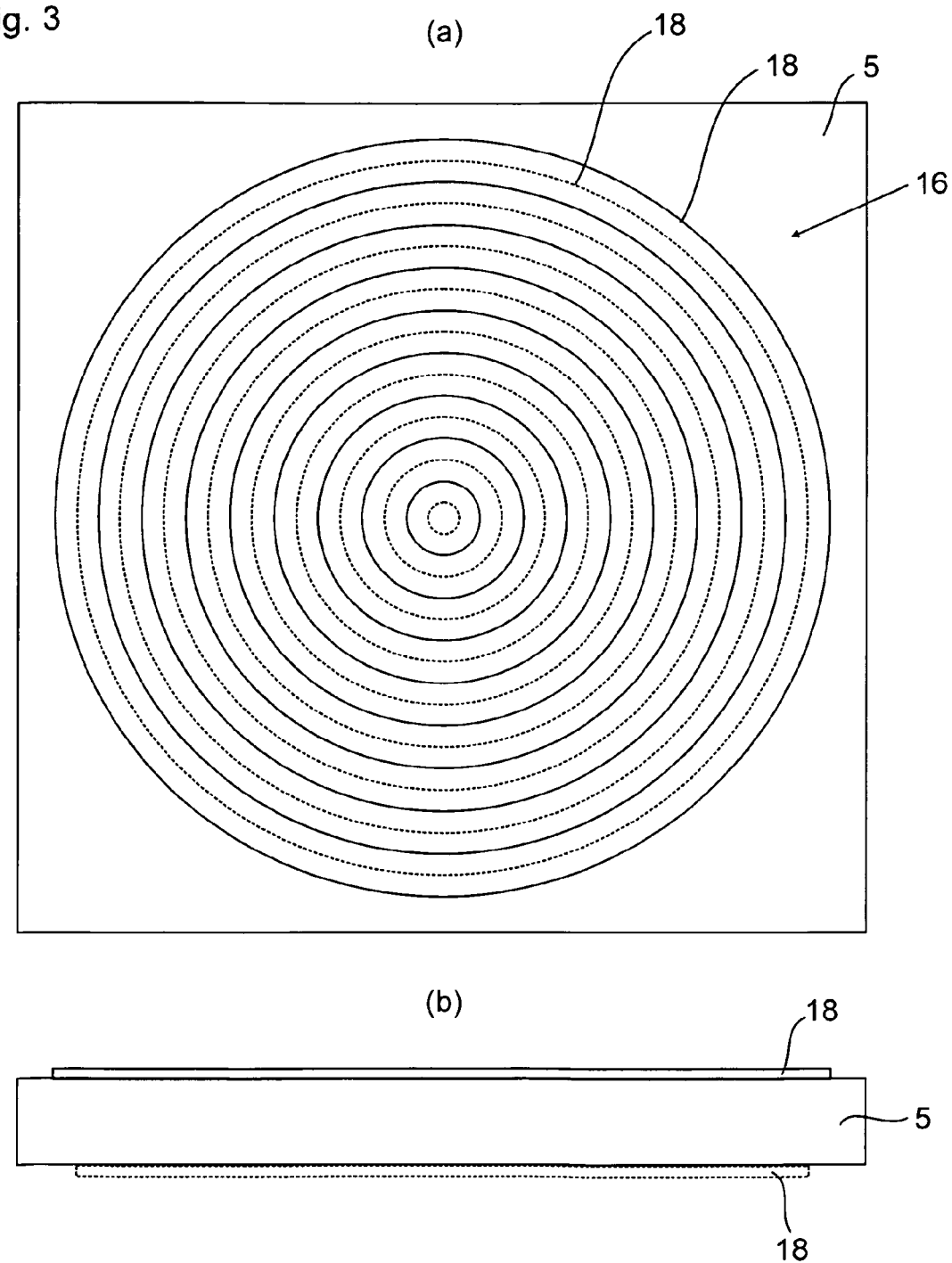

Fig. 4
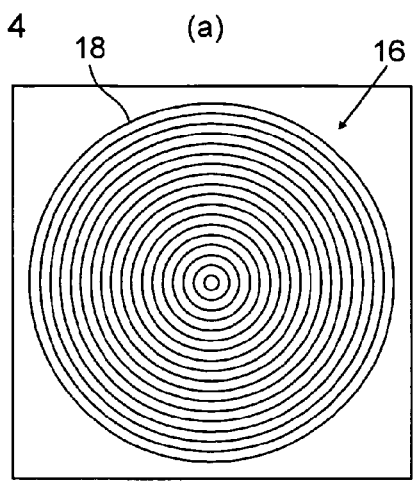 (a)
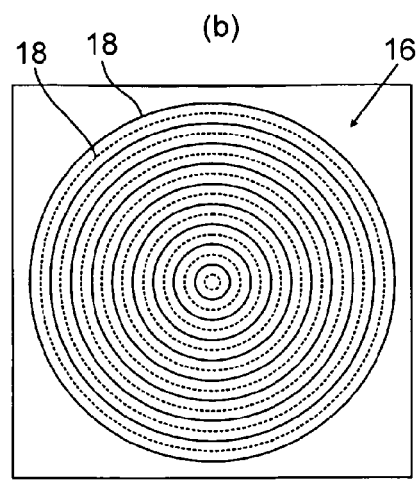 (b)
Fig. 5
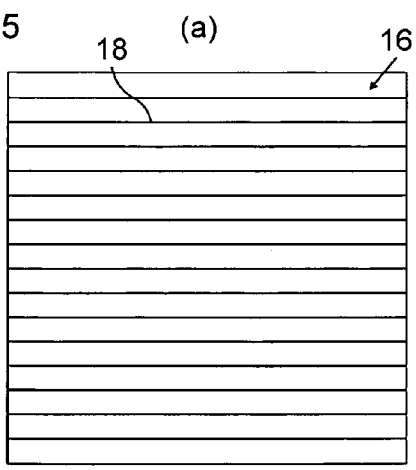 (a)
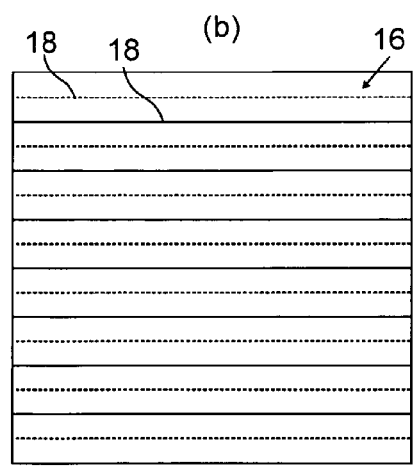 (b)
Fig. 6
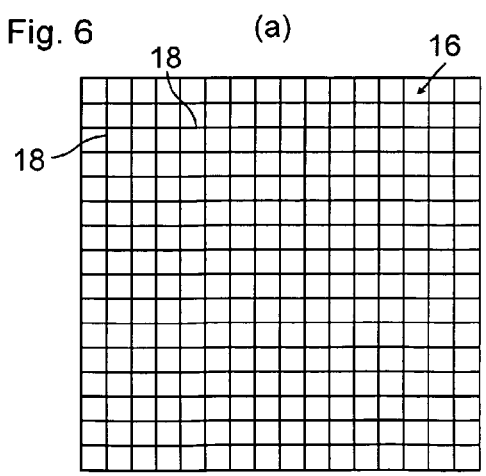 (a)
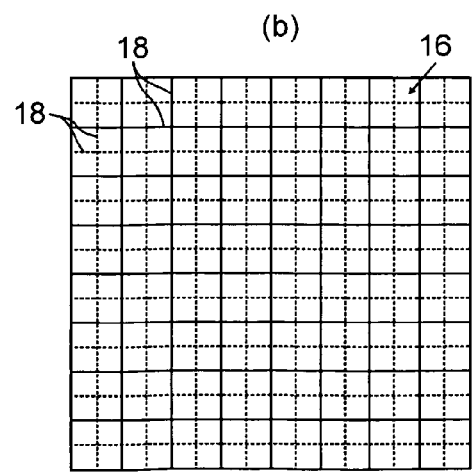 (b)

DEVICE FOR DETERMINING THE TEMPERATURE OF A SUBSTRATE

RELATED APPLICATIONS

This application corresponds to PCT/EP2012/004347, filed Oct. 17, 2012, which claims the benefit of German Application No. 10 2011 116 243.0, filed Oct. 17, 2011, the subject matter of which is incorporated herein by reference in its entirety.

BACKGROUND OF THE INVENTION

The present invention relates to an apparatus for determining the temperature of a substrate, in particular a semiconductor substrate, as well as to an apparatus and a method for the thermal treatment of substrates, in particular semiconductor substrates.

In the art, different apparatuses and methods for thermally treating substrates are known, as well as apparatuses for determining the temperature of a substrate during a thermal treatment.

A known method for thermally treating semiconductor wafers provides for heating of the semiconductor wafers e.g. by means of electromagnetic radiation which is emitted by lamps such as tungsten halogen lamps. For a close loop temperature control of the thermal treatment it is known to determine the temperature of the semiconductor wafer during the treatment by means of a radiometer or pyrometer directed onto the substrate. Since the radiometer, however, typically does not only detect radiation emitted from the semiconductor wafer but also radiation which is reflected at the semiconductor wafer and in some cases radiation which is transmitted through the semiconductor wafer, a differentiation between these radiation fractions is necessary for determining the temperature.

U.S. Pat. No. 5,318,362 describes the so-called ripple technique for such a differentiation, in which a frequency is impressed on the radiation emitted by the lamp via a respective controller. Originally, the AC frequency of the power supply was used and this technique was refined over time and other frequencies were impressed. Changes in the temperature of the semiconductor wafer occur substantially slower in comparison to the impressed frequency. Therefore, the radiation emitted by the semiconductor wafer due to its own temperature does not contain the frequency impressed on the radiation emitted by the lamps and is therefore distinguishable therefrom.

The frequency impressed on the radiation from the lamps now for example enables by means of a respective frequency dependent filtering of the signal of the radiometer, a separation of reflected/transmitted radiation from the radiation emitted by the semiconductor wafer.

In certain applications, however, impressing a frequency via a controller of the lamps is not possible or not desired. This is for example the case when flashbulbs, which are also known as flash lamps, discharge lamps or arc lamps are operated via a bank of capacitors. Such lamps are in particular utilized for short term very rapid temperature increases of surface areas of the substrate and short term annealing processes. Such lamps are typically used in combination with other lamps, such as the above cited ones, which are inter alia used for preheating the semiconductor wafer. During the operation of flash lamps by means of a bank of capacitors, a temperature measurement using the above mentioned technique is, therefore, not possible, since a modulation of the lamp radiation caused by a controller is not provided.

SUMMARY OF THE INVENTION

It is therefore an object of the invention to provide an apparatus and a method for thermally treating substrates, as well as an apparatus for determining the temperature of a substrate, which is independent of a modulation of lamp radiation caused by a controller and is capable of providing the determination of the temperature based on radiation.

In accordance with the invention this object is achieved by an apparatus for determining the temperature of a substrate in accordance with claim 1, an apparatus for thermally treating substrates in accordance with claim 2 and a method for thermally treating substrates in accordance with claim 11. Further embodiments of the invention are shown in the respective dependent claims and the specification.

The apparatus for determining the temperature of a substrate, in particular of a semiconductor substrate during a heating thereof by means of a first radiation source comprises: a first grating structure having grating lines, which are opaque with respect to a substantial portion of the radiation of the first radiation source, wherein the grating structure is arranged between the first radiation source and the substrate, a drive unit for moving the first grating structure, a first radiation detector, which is directly (i.e. not through the grating structure) directed onto the surface of the substrate facing the grating structure, and a device for determining radiation emitted by the substrate due to its own temperature and for determining the temperature of the substrate on the basis of the radiation detected by the first radiation detector. Such an apparatus makes it possible to generate a modulation of radiation from a first radiation source which impinges on the substrate independent of controlling the first radiation source. The modulation may be used in a known manner for determining the temperature of the substrate, since it can be used for differentiating the radiation emitted by the substrate due to its own temperature and the radiation which is reflected at the substrate and/or which is transmitted through the substrate. This is particularly advantageous for radiation sources in which the lamp radiation may not be modulated by means of a controller, such as flash lamps, which are energized with a direct current.

The apparatus for thermally treating substrates, in particular semiconductor substrates, comprises an apparatus for determining the temperature of substrates of the above mentioned type, at least one substrate carrier and at least one first radiation source for heating a substrate received on the substrate carrier, wherein the first grating structure is arranged between the at least one first radiation source and the substrate carrier. Such an apparatus enables a thermal treatment of substrates by means of radiation heating and a determination of the temperature of the substrates based on radiation during heating of the substrate.

The apparatus preferably comprises a second radiation detector, which is directed onto the first radiation source through the first grating structure and a device for determining the radiation intensity emitted by the first radiation source. This enables an improved determination of the temperature of the substrate independent of knowledge about reflectivity of the substrate, as is known in the art, where the radiation of the radiation sources is modulated by means of a respective controller.

In one embodiment, a shield which is substantially transparent to the radiation from the at least one first radiation source, preferably made of quartz, is provided, wherein the shield is arranged between the at least one first radiation source and the substrate/substrate carrier. Such a shield allows to prohibit or at least reduce an influence of the process atmosphere surrounding the substrate on the at least one first radiation source. In one embodiment, the grating structure is formed on the shield, wherein the shield is formed as an oscillator, the shield then forming the drive unit. This leads to a simple structure of the apparatus. If the shield is formed as an oscillator, whose upper and lower surfaces move into opposite directions during oscillation, it may be particularly beneficial to form grating structures on the upper surfaces and the lower surface of the shield. Since in this embodiment, the upper and lower surfaces typically perform a movement in opposite directions, a two sided grating structure may lead to an increase in the frequency in particular to a doubling of the frequency.

In an alternative embodiment the drive unit comprises a piezo actuator or a voice coil, which may provide a sufficient stroke at a high frequency. For achieving a homogeneous scanning of the shadowing structure over the substrate, the drive unit is preferably designed to and arranged such that a movement of the grating structure occurs substantially parallel to a surface of the substrate facing the grating structure. The stroke of the voice coil or of the piezo actuator may be matched to the grating constant of the grating such that the stroke corresponds to a multiple of the grating constant. In doing so, it is possible that during a stroke of the voice coil or of the piezo actuator a plurality of grating structure moves through the detector's field of view (which for example is also matched to the grating constant), such that the detector detects a supposedly higher frequency as provided by the voice coil or the piezo actuator. In particular, a doubling of the frequency or another multiplication of the frequency may be achieved.

The apparatus is particularly advantageous when the at least one first radiation source comprises a flash lamp, the radiation of which cannot be modulated by an electrical controller.

In a further embodiment, the apparatus comprises at least a second radiation source, a second grating structure having grating lines, which are substantially opaque to radiation from the at least one second radiation source, wherein the grating structure is arranged between the at least one second radiation source and the substrate, and at least one drive unit for moving the second grating structure. The at least one first radiation source and the at least one second radiation source are arranged such that the substrate may be received therebetween. By the combination of two radiation sources an improved thermal treatment may be achieved. In particular, a lower mechanical stress in the substrate may be achieved at the same amount of energy of the flash lamps, higher temperatures of the substrates and an improved temperature control may be achieved. Since the radiation of the second radiation source is modulated in the same manner as the first radiation source, also the radiation fraction thereof, which is detected at the first radiation detector, may be differentiated from substrate emissions during a determination of the temperature.

The method for thermally treating substrates, in particular semiconductor wafers, comprises the following steps: heating the substrate by means of a first radiation, which is emitted by at least one first radiation source, wherein the first radiation passes through a first grating structure on its way from the at least one first one radiation source to a first side of the substrate, thereby generating a shading pattern on the first side of the substrate, said pattern corresponding to the grating structure, and moving the grating structure and thus the shading pattern on the first side of the substrate such that the radiation of the first radiation source impinging onto the substrate comprises a modulation corresponding to the movement. Furthermore, radiation coming from the substrate is detected with a first radiation detector, which is directed onto the first side of the substrate, wherein the detected radiation comprises at least a first radiation fraction and a second radiation fraction, wherein the first radiation fraction consists of radiation emitted by the substrate due to its own temperature and the second radiation fraction consists of radiation of the at least one first radiation source reflected at the substrate, which radiation comprises the modulation corresponding to the movement of the grating structure. From the radiation detected at the first radiation detector, the first radiation fraction is determined, taking into consideration the modulation of the second radiation fraction, and on the basis of the first radiation fraction, the temperature of the substrate is determined. The method uses a mechanical movement of a grating structure for generating a modulation of the radiation. The method is therefore capable of determining a temperature on the basis of radiation independent of a modulated controlling of the radiation source.

Preferably, the movement of the grating structure is a periodical movement having a predetermined frequency, wherein the second radiation fraction is preferably suppressed by means of a frequency filtering of the detected total radiation for determining the first radiation fraction. This enables simple determination of the first radiation fraction for the temperature determination.

For improving the temperature determination, radiation, which is emitted from the radiation source and comprises the modulation, is detected by means of a second radiation detector, which is directed onto the at least one first radiation source through the grating structure, wherein the result of this detection is taken into consideration when determining the temperature of the substrate.

In one embodiment the grating structure is formed on an oscillator and the movement of the grating structure is generated by inducing an oscillation of the oscillator. This leads to a simple structure and simple control for generating the modulation. Preferably, the movement of the grating structure is in substance parallel to the surface of the substrate facing the grating structure. The method is in particular beneficial when the first radiation is generated by at least one flash lamp.

In a further embodiment, the method comprises heating the substrate with at least one second radiation, which is emitted by at least one second radiation source, wherein the second radiation, on its way from the at least one second radiation source, passes through a second grating structure and impinges on a second side of the substrate, thereby generating a shading pattern on the second side of the substrate, which corresponds to the second grating structure, and moving the second grating structure such that the radiation of the second radiation source, which impinges onto the substrate, comprises a modulation corresponding to the movement. The radiation detected at the first radiation detector may therefore comprise at least of a third radiation fraction, which consists of radiation of the at least one second radiation source, which is transmitted through the substrate, which radiation comprises the modulation corresponding to the movement of the second grating structure and when determining the first radiation fraction from the detected total radiation at the first radiation detector, the modulation of the third radiation fraction is taken into consideration.

BRIEF DESCRIPTION OF THE DRAWINGS

The invention will be described in more detail with reference to the drawings. In the drawings:

FIG. 1 is a schematic side sectional view of an apparatus for thermally treating semiconductor wafers;

FIG. 2 is a schematic side sectional view of an apparatus for thermally treating semiconductor wafers in accordance with an alternative embodiment;

FIG. 3 is a schematic top view (FIG. 3(a)) and a schematic side view (FIG. 3(b)) of a wall element, as provided in an apparatus according to FIG. 1;

FIGS. 4 to 6 are schematic top views of grating structures, wherein the grating structures of FIGS. 4(a), 5(a) and 6(a) could be provided in an apparatus according to FIG. 2 and the grating structures of FIGS. 4(b), 5(b) and 6(b) could be provided in an apparatus according to FIG. 1.

DESCRIPTION OF EMBODIMENTS

Figure 7:
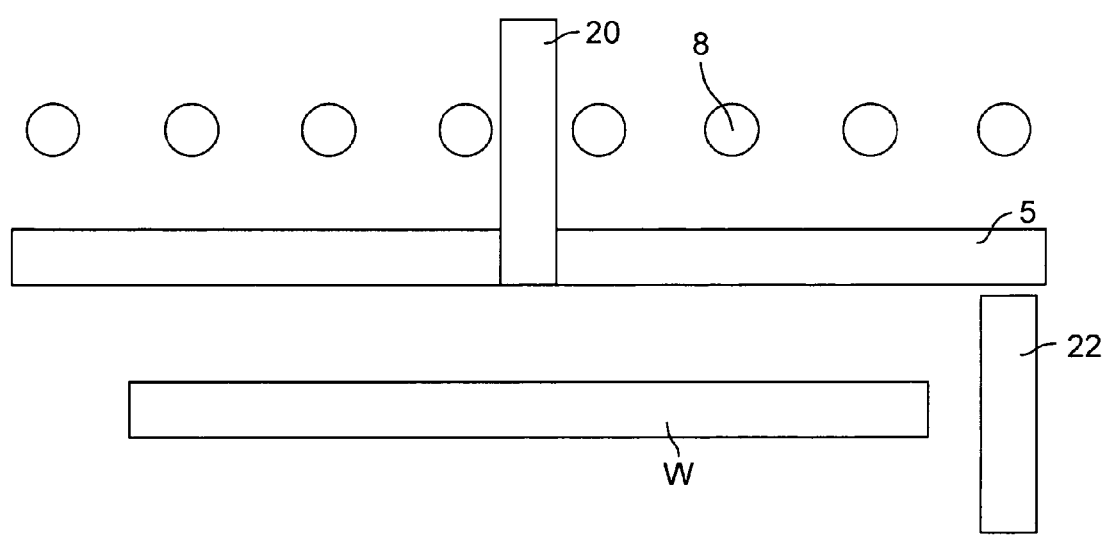
FIG. 7 is a schematic functional diagram of a further embodiment of the invention.

Terms, such as above, below, left and right and similar terms as used in the following description refer to the drawings and should not be seen in a limited manner despite the fact that they refer to a preferred embodiment. The term "substantially" referring to angles and arrangements should include deviations of up to 10° preferably of up to 5°, unless other indications are given. The term "for a substantial portion" is supposed to include at least 10%, preferably at least 15% of the following parameter.

FIG. 1 shows a schematic side sectional view of an apparatus 1 for thermally treating semiconductor wafers W. The apparatus 1 comprises a housing 2 having an interior space, which inter alia forms a process chamber 3. The process chamber 3 is bounded at its upper and lower ends by wall elements 5 and 6 respectively and on its sides by the housing 2. Above the wall element 5 a lamp chamber 7 is provided in the housing 2, which lamp chamber may have a mirrored surface. A heating source in the form of several lamps 8 is provided in lamp chamber 7. Below the wall element 6 another lamp chamber 9 similar to chamber 7 is provided, in which a heating source in the form of several lamps 10 is provided.

The side walls of the process chamber 3 may also have a certain mirror effect for at least a portion of the electromagnetic radiation which is present in the process chamber 3. Furthermore, at least one of the side walls of the process chamber 3 includes a process chamber door for enabling loading and unloading of the semiconductor wafer W. Furthermore, gas inlets and gas outlets for the process chamber (not shown) may be provided.

A light transforming plate 12, which is also called a Hot Liner®, is provided within the process chamber 3. The plate 12 extends parallel to the lower wall element 6. On an upper surface of the light transforming plate 12, spacers 13 are provided, onto which the semiconductor wafer W is placed, such that it extends parallel to the lower light transforming plate 12 and is held spaced thereto. The light transforming plate 12 for example consists of a material having a high coefficient of absorption for the radiation emitted by the lamps 10 (and possibly lamps 8). Thus, the light transforming plate 12 in operation absorbs the radiation emitted by the lamps 10 and subsequently emits heating radiation for heating the semiconductor wafer W, wherein the heating radiation has a different wave length to the wave length of the lamp radiation. Alternatively, it would also be possible to form the light transforming plate from a material which is in substance transparent to the radiation of lamps 10 (and possibly lamps 8), as is known in the technical field. Optionally, the plate may be connected to a rotating mechanism and a compensation ring may be provided in the process chamber 3, which radially surrounds the substrate in its plane, as is known in the technical field of RTP systems.

The wall elements 5 and 6, which border the process chamber 3 at its upper and lower ends, each consists of quartz and are formed as quartz oscillators comprising an AT-cut (approximately at an 35° 15' angle with respect to the z-axis). Such a cutting angle is common for quartz oscillators available on the market. It is, however, possible to provide different cutting angles for the quartz oscillators.

The wall elements 5, 6 as such are in substance transparent to the radiation of the lamps 8, 10. On the upper surface and the lower surface, each wall element 5, 6 comprises a grating structure 16 which is formed by grating lines 18. Different structures may be used as the grating structure, each structure being formed by a plurality of lines which form a common structure, wherein the lines preferably have a uniform spacing. The grating lines 18 on the upper surface and the lower surface of the wall elements 5, 6 are preferably off-set to each other and they may form a uniform total structure in a top view.

The grating lines 18 may be formed by applying material onto the surface or by treating the surface of the wall elements 5, 6 which treatment locally changes the reflection and absorption characteristics of the wall element. The grating lines 18 are opaque for a substantial portion of the radiation of the lamps 8, 10. Here the terminology "for a substantial portion of the radiation" means that at least 10% preferably at least 15% of the radiation fraction, which would otherwise pass through the wall element 5, 6, is absorbed or reflected at the grating lines 18.

During operation, the grating structure 16, leads to a partial shading of the lamp radiation on the semiconductor wafer W, which shading corresponds to the shape of the grating. By means of a respective excitation of the wall elements 5, 6, which are formed as quartz oscillators, the shading is not stationary on the semiconductor wafer W, but the shading moves in correspondence to the oscillation of the wall elements. Such a respective oscillation would cause opposite movements of the grating structures 16 on the respective upper and lower sides of the wall elements 5, 6. It would, however, also be possible to only provide a grating structure 16 on the upper side or the lower side of the wall element 5, 6. In the case of applying material to the wall element, such material would preferably be applied to the side of the wall element facing away from the processing space. The amplitude of the oscillation of the wall elements 5, 6 should be matched to the grating structure 16, such that in operation the shading areas scan the complete surface of the semiconductor wafer W in a substantially uniform manner. By means of forming two off-set grating structures on the upper and lower sides of the wall elements, a frequency increase, in particular a frequency, doubling may be achieved. The frequency increase could be further amplified by the arrangement of further grating structures, which are provided apart from the wall elements and are moved in a corresponding manner.

The grating lines are preferably formed in an area of projection of the semiconductor wafer W but preferably also extends beyond this area of projection, such that radiation being emitted from lamps 8, 10 may not directly fall onto the semiconductor wafer W and preferably also not via a one time reflection of said radiation. The grating lines 18 may in projection cover e.g. 30% of the surface of the wall element 5. Assuming a 10% absorption/reflection of radiation by the grating lines 18, a 3% loss of energy and a corresponding (amplitude) modulation of the lamp radiation would result. Obviously other amounts of the surface may be covered by the grating lines 18 and the grating lines may have a different value of absorption/reflection. In particular, a higher value of absorption/reflection may lead to a larger (amplitude) modulation of the lamp radiation, which may enhance detectability thereof.

FIG. 3 shows a schematic top view (FIG. 3(*a*)) and an schematic side view (FIG. 3(*b*)) of an exemplary wall element 5, which is used in the apparatus according to FIG. 1, wherein the grating structure 16 is formed by the application of material in the form of grating lines 18. As may be seen in the top view according to FIG. 3(*a*), the grating structure 16 is formed by a plurality of concentric grating lines 18. In this case, the grating lines 18, which are present on the upper surface of the wall element 5 are shown by full lines, while the grating lines which are present on the lower surface of the wall element 5 are shown by broken lines. In the top view, the grating structure 16 on the upper surface alternates with the grating lines 18 on the lower surface and they are otherwise arranged with a uniform spacing. Obviously, other grating structures 16 are possible, as is explained in more detail herein below with respect to FIGS. 4-6.

Even though the wall elements 5, 6 are formed as quartz oscillators in the described embodiment, it is to be noted that the wall elements 5, 6 may also be made from different materials which are in substance transparent to the lamp radiation and which may be provided with the respective grating structure 16. For moving the grating structure 16, for example an external drive unit such as a piezo actuator or a voice coil (which is also known as a plunger coil actuator), may be provided, which is arranged such that in operation the wall elements 5, 6 may be laterally reciprocated. The movement should be in substance parallel to the surface of the semiconductor wafer W.

In the embodiment as shown, the lamps 8 are so-called flash lamps, which are typically operated in a flash-mode, and the lamps 10 are tungsten-halogen lamps, which are typically operated in a continuous mode. The lamps may also be arranged differently and it is in particular possible that the types of lamps are combined with each other or with other types of lamps. It is also possible to dispense with the lamp chamber 9 and the lamps 10, and to only provide the upper lamp chamber 7 including lamps 8 or possibly different types of lamps.

The apparatus 1 further comprises a first pyrometer, which is directed on the upper surface of the semiconductor wafer W, wherein the pyrometer will be referred to as substrate pyrometer 20 herein below, as well as a second pyrometer, which is directed on at least one of the lamps 8 and which pyrometer will be referred to as lamp pyrometer 22 herein below.

The substrate pyrometer 20 is directed onto the upper surface of the semiconductor wafer W in such a way that radiation which comes from the substrate, which enters the substrate pyrometer 20 does not pass through the grating structure 16. In the presentation according to FIG. 1 the substrate pyrometer 20 is shown in such a way that it is mounted on a side of the housing 2 and that it is directed onto the semiconductor wafer W from the side. It is, however, also possible that the substrate pyrometer 20 is for example directed in a perpendicular manner from above onto the semiconductor wafer W and that for example the grating structure is absent in the substrate pyrometer 20's field of view. The substrate pyrometer 20 could for example be directed in a perpendicular manner onto the upper surface of the semiconductor wafer by means of an optical fiber, which extends through the lamp chamber 7 and possibly a corresponding opening in the upper wall 5 in a shielded manner while bypassing the grating structure. In doing so, the substrate pyrometer should preferably be decoupled from the movement of the upper wall.

The substrate pyrometer 20 is therefore capable of detecting radiation emitted from the semiconductor wafer W as well as radiation coming from the lamps 8, which is reflected at the semiconductor wafer W, wherein the radiation comprises the above mentioned modulation. The substrate pyrometer 20 may also detect radiation coming from the lamps 10, which is transmitted through the semiconductor wafer W, and which may comprise a modulation (in accordance with the movement of the lower grating structures 16, 26). Furthermore, possibly also other radiation fractions (with and without modulation) which may for example enter the substrate pyrometer 20 via multiple reflections may be detected, wherein said radiation fractions, however, are neglected in the following. Such radiation fractions may be reduced by suitable structures, which for example only pass radiation coming from the wafer along a defined axis of view, as is known in the art.

The lamp pyrometer 22 is directed onto one of the lamps 8 in such a manner that radiation coming from the lamp enters the pyrometer 22 through the grating structure 16. In the representation of FIG. 1, the lamp pyrometer 22 is shown such that it is mounted to a side of the housing 2 and that it is directed onto one lamp 8 from a side of the process chamber. It is also possible that the lamp pyrometer 22 is for example directed onto one of the lamps 8 from below through the grating structure 16 and in a substantially perpendicular manner.

The lamp pyrometer 22 is arranged in such a manner that it substantially only detects the radiation emitted from the lamp(s) 8 after passing through the grating structure 16, i.e. the modulated radiation.

In operation, an evaluation circuit (not shown), which is connected to the substrate pyrometer 20, may extract the radiation which is emitted by the semiconductor wafer W and which is detected by the substrate pyrometer 20 and may also determine the temperature of the semiconductor wafer W therefrom. For this purpose, a frequency filtering, in particular a low pass filtering may be applied to the signal of the substrate pyrometer 20, in order to filter out radiation fractions, which include a modulation caused by movement of the grating structure. The radiation, which is emitted by the wafer due to its own temperature, does not include this modulation, as the wafer temperature does not change so rapid. Via the signal of the lamp pyrometer 18, the intensity of the lamp radiation may be determined, which may also be beneficial for determining the temperature of the wafer. In particular, by this means, the intensity of the radiation of the lamp 8, which is reflected at the semiconductor wafer W and is not modulated, i.e. the so-called lamp background may be determined.

FIG. 2 shows a schematic side view of an apparatus 1 for thermally treating semiconductor wafers in accordance with an alternative design. In the description of FIG. 2 the same reference signs that were used in the description of the design of FIG. 1 are used for the same or similar elements. Therefore, reference is made to the previous description in order to avoid repetition. In the following, only the differences between the designs are highlighted.

The apparatus 1 is in substance structured in the same way as the previously described apparatus 1 with the exception that the walls 5, 6 do not provide a grating structure. However, both in the lamp chamber 7 as well as in the lamp chamber 9 separate grating structure elements 26 are provided respectively between the lamps 8, 10 and the walls 5, 6. The grating structure elements 26 extend in substance parallel to the respective walls 5, 6.

Each grating structure element 26 again has a grating structure 16 formed by grating lines 18, which are opaque to a substantial portion of the radiation of the lamps 8, 10. The term "for a substantial portion of the radiation" means that at least 10% preferably at least 15% of the radiation fraction, which would otherwise pass through the grating structure element 16 are absorbed at the grating lines 18 or are reflected thereby.

The grating structure element 26 may have a base body with the grating structure 16 being formed thereon or therein. The base body should be made of a material, which is in substance transparent to the radiation of the lamps 8, 9. For example, the base body may be formed by a thin quartz plate. By providing a separate grating structure element 26 adjacent to the wall elements 5, 6 it is possible that the modulation of the lamp radiation may be achieved independent of other functions of the wall elements 5, 6, such as providing a sealing between the process chamber and the lamp chamber. In particular, the grating structure element 26 may be made of a very thin material having a low mass, in order to reduce the mass to be moved during the modulation of the lamp radiation. In one embodiment the grating structure could for example be formed by an arrangement of structural elements, such as for example wires, fibers or plates, which form the grating lines 18 of the grating structure 16 without being attached to a base body carrying the same. Such an arrangement could have a support frame but such a frame may be dispensed with if the structural elements have a sufficient stiffness and can be arranged in a self-supporting manner.

The grating structure element 26 is connected to at least one drive unit which is not shown to provide a lateral movement (i.e. in the plane of the grating structure element 26) and thus a corresponding movement of the shading areas on a semiconductor wafer W during operation thereof. The movement may be performed along one axis or also along two preferably orthogonal axes. Again, a piezo actuator or a voice coil may be used as the drive unit. Alternatively, the base body of the grating structure element 26 may again be formed as an oscillator. The piezo actuator, the voice coil and also the quartz oscillator may cause a reciprocal movement of the grating structure 16. It is also possible to provide a rotational drive for the grating structure element 26, which comprises a respective grating structure for generating the moving shading areas. Also, a combination of a rotational and a lateral movement is feasible.

FIGS. 4 to 6 show schematic top views of different grating structures 16, wherein the grating structures of FIGS. 4a, 5a and 6a each show a single arrangement of grating lines 18, while FIGS. 4b, 5b and 6b each show a dual arrangement of grating lines 18 on the front and back side of a carrier element, in particular a quartz oscillator. In the view of FIGS. 4b, 5b and 6b the solid lines for example show grating lines 18 on the front side of a carrier element, while the broken lines show grating lines 18 on the back side of the carrier element.

FIGS. 4a and 4b show for example a grating structure 16, which is formed by a plurality of concentrically arranged circular grating lines 18. FIGS. 5a and 5b for example show a grating structure 16, which is formed by a plurality of straight grating lines 18 which extend in parallel. FIGS. 6a and 6b show a grating structure 16 which is formed by two groups of straight grating lines 18, wherein the grating lines 18 within each group extend in parallel and wherein the grating lines 18 of the respective groups intersect at right angles. As the skilled person will realize, different grating structures are possible and only a few thereof are shown. The grating lines allow an at least partial (in the substrate pyrometer's field of view) periodic shading of the surface of the semiconductor wafer.

The grating structures should be matched to the drive unit such that during operation thereof, the shading areas being formed on the semiconductor wafer W preferably scan all surface areas of the semiconductor wafer W in a homogeneous manner.

FIG. 7 shows a schematic functional diagram of a simplified embodiment of the invention, wherein again the same reference signs are used as in the previous designs for the same or similar elements.

FIG. 7 shows a semiconductor wafer W, a wall element 5 arranged there above, an upper arrangement of lamps 8, a substrate pyrometer 20 and a lamp pyrometer 22. As such an apparatus is shown, which provides a radiation heating only from above the semiconductor wafer W. As well as in the embodiment of FIG. 1, the wall element 5 comprises a grating structure (not shown) and is formed as a quartz oscillator. The lamps 8 are arranged above the wall element 5 and are for example again so-called flash lamps. Again, the wall element, however, may also be formed as a simple quartz plate, which may be moved via an external drive unit, such as a piezo actuator or a voice coil.

The substrate pyrometer 20 extends between the lamps 8 and through a hole in the wall element 5. In the area of the hole in the wall element, a gap is provided in the grating structure such that the substrate pyrometer 20 has a clear view onto the surface of the semiconductor wafer W. Obviously, the substrate pyrometer 20 may also be arranged differently and an optical fiber may be provided, which extends between the lamps 8 and through a hole in the wall element 5 in order to provide a clear view of the substrate pyrometer 20 onto the surface of the semiconductor wafer. The substrate pyrometer 20 or optical light fiber is shielded with respect to direct radiation from the lamps 8.

The lamp pyrometer 22 is directed through the wall element 5 and the grating structure 16 onto one of the lamps 8 and is shielded with respect to radiation coming from the semiconductor wafer W. Also here, an arrangement having a light fiber may be used, in order to have a larger flexibility with respect to the arrangement of the lamp pyrometer 22.

During operation of the apparatus, the semiconductor wafer W is heated via the lamps 8. The grating structure leads to shading areas on the surface of the semiconductor wafer W, which by means of a movement of the grating structure via an oscillation (or a movement) of the wall element is scanned across the surface of the semiconductor wafer W. Hereby, the radiation of the lamps 8 below the wall element has a modulation corresponding to the movement.

At the substrate pyrometer 20, the radiation being emitted by the semiconductor wafer W due to its own temperature as well as radiation which is emitted by the lamps 8 and reflected by the semiconductor wafer W is detected. Furthermore, the detected radiation may also include transmission components which are, however, not taken into consideration in the following description. The radiation, which is reflected at the semiconductor wafer W, has a modulation which is caused by the movement of the grating structure, while the radiation emitted by the wafer due to its own temperature does not have this modulation. By means of a respective filtering of the signal of the substrate pyrometer 20, the fraction of the total radiation which corresponds to the radiation emitted by the semiconductor wafer W due to its own temperature may be determined and from this fraction the temperature of the semiconductor wafer W may be determined.

To assist the determination of the temperature independent of the knowledge of the emissivity of the semiconductor wafer W, the signal of the lamp pyrometer 22 may also be taken into consideration, as is known in the art.

The invention was described with respect to preferred embodiments of the invention without being limited to these specific embodiments. For example, for generating the movement of the grating structure, different mechanisms may be used, whereby the type of movement may lead to different grating structures. For example in combination with a rotational movement, an arrangement of grating lines, which extend radially with respect to a center point, may be beneficial. The combination of shading pattern and movement of the same should preferably lead to a homogeneous scanning of all surface areas of the semiconductor wafer W. With respect to the lower lamps it is also possible, to provide a modulation by means of a known lamp drive controller in lieu of the mechanical modulation. In the embodiment including lower lamps, also further radiation meters such as pyrometers, could be provided. In particular, a substrate pyrometer may be directed onto the back side similar to the substrate pyrometer 20 which is directed onto the top side. Such a radiation meter may also be used in an advantageous manner without providing lower lamps 10 in order to determine the impact of the operation of the lamps 8 onto the temperature of the whole semiconductor wafer (not only on the surface facing the lamps 8). Furthermore, another lamp pyrometer may be provided, which is for example directed through the grating structure onto the lamps 10. If the radiation of the lamps 10 is not modulated by means of a grating structure but by means of controlling the driving of the lamps 10, the radiation meter may also be directed onto at least one of the lamps 10 in a known manner from below and through the housing 2.

The features of the different embodiments are freely combinable with the features of other embodiments or they may be exchanged, as long as they are compatible. In particular, also an apparatus may be formed which comprises several grating structures arranged on top of each other, and which may optionally be moved separately.

The invention claimed is:

1. An apparatus for determining the temperature of a substrate (W), in particular of a semiconductor wafer during a heating thereof by means of a first radiation source (8), said apparatus comprising:
 a first grating structure (16) having grating lines (18), which are opaque with respect to a substantial portion of the radiation of the first radiation source, wherein the grating structure (16) is arranged between the first radiation source and the substrate;
 a drive unit for moving the first grating structure (16);
 a first radiation detector (20), which is directed directly onto the surface of the substrate (W) facing the grating structure (16), and
 a device for determining radiation emitted by the substrate (W) due to its own temperature and for determining the temperature of the substrate (W) on the basis of the radiation detected by the first radiation detector.

2. An apparatus (1) for thermally treating substrates (W), in particular semiconductor wafers, said apparatus comprising:
 an apparatus for determining the temperature of substrates (W) of claim 1;
 at least one substrate carrier (12, 13); and at least one first radiation source (8) for heating a substrate (W) received on the substrate carrier (12, 13), wherein the first grating structure (16) is arranged between the at least one first radiation source (8) and the substrate carrier (12, 13).

3. The apparatus of claim 1, further comprising:
 a second radiation detector (22), which is directed onto at least one first radiation source (8) through the first grating structure (16), and
 a device for determining the radiation intensity emitted by the first radiation source (8).

4. The apparatus of claim 1, comprising a shield (5; 26) which is substantially transparent to the radiation from the at least one first radiation source (8), the shield preferably made of quartz, wherein the shield (5; 26) is arranged between the at least one first radiation source and the substrate/substrate carrier.

5. The apparatus of claim 4, wherein the grating structure (16) is formed on the shield (5; 26).

6. The apparatus of claim 5, wherein the shield is formed as an oscillator, which forms the drive unit.

7. The apparatus of claim 1, wherein the drive unit comprises a piezo actuator or a voice coil.

8. The apparatus of claim 1, wherein the drive unit is constructed and arranged to cause a movement of the grating structure (16) in a direction which is in substance parallel to a surface of the substrate (W), which faces the grating structure (16).

9. The apparatus of claim 1, wherein the at least one first radiation source comprises a flash lamp.

10. The apparatus of claim 1, further comprising:
 at least one second radiation source (10);
 a second grating structure (16) having grating lines (18), which are opaque to a substantial portion of the radiation from the at least one second radiation source (10), wherein the grating structure (16) is arranged between the at least one second radiation source (10) and the substrate (W); and
 at least one drive unit for moving the second grating structure (16),
 wherein the at least one first radiation source and the at least one second radiation source are arranged such that the substrate (W) may be received therebetween.

11. The apparatus of claim 1, wherein the device extracts the radiation emitted by the substrate (W) due to its own temperature from the radiation detected by the first radiation detector (20) and determines the temperature of the substrate (W) on the basis of the extracted radiation.

12. The apparatus of claim 1, wherein the drive unit moves the first grating structure (16) laterally within a plane.

13. The apparatus of claim 1, wherein the detected radiation comprises at least a first radiation fraction, a second radiation fraction, and a modulation, wherein the first radiation fraction is the radiation emitted by the substrate due to its own temperature, the second radiation fraction is the radiation of the first radiation source reflected at the substrate, and the modulation corresponds to the movement of the grating structure, the device further comprising a low pass filter that filters out the first radiation fraction from the detected radiation in order to determine the temperature of the substrate.

* * * * *